(12) United States Patent
Gavagnin et al.

(10) Patent No.: US 11,197,367 B2
(45) Date of Patent: Dec. 7, 2021

(54) COMPONENT CARRIER COMPRISING A DOUBLE LAYER STRUCTURE

(71) Applicant: AT&S Austria Technologie & Systemtechnik Aktiengesellschaft, Leoben (AT)

(72) Inventors: Marco Gavagnin, Leoben (AT); Gernot Schulz, Graz (AT); Erich Schlaffer, St. Lorenzen (AT); Jonathan Silvano De Sousa, Vienna (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/840,620

(22) Filed: Apr. 6, 2020

(65) Prior Publication Data
US 2020/0329555 A1 Oct. 15, 2020

(30) Foreign Application Priority Data

Apr. 10, 2019 (EP) .................... 19168416

(51) Int. Cl.
*H05K 1/02* (2006.01)
*H01L 21/48* (2006.01)
(Continued)

(52) U.S. Cl.
CPC ....... *H05K 1/0237* (2013.01); *H01L 21/4857* (2013.01); *H01L 23/49822* (2013.01);
(Continued)

(58) Field of Classification Search
CPC .... H05K 1/0237; H05K 1/0366; H05K 1/181; H05K 3/146; H05K 3/4644;
(Continued)

(56) References Cited

U.S. PATENT DOCUMENTS 9,009,376 B2   4/2015   Amemura
9,137,892 B2   9/2015   Bando et al.
(Continued)

FOREIGN PATENT DOCUMENTS

CN    105338798 A    2/2016
JP    2005-347378 A    12/2005
(Continued)

OTHER PUBLICATIONS

KR20130132103 English Translation, Samsung (Year: 2013).*
(Continued)

*Primary Examiner* — Steven T Sawyer
(74) *Attorney, Agent, or Firm* — Robert A. Blaha; Smith Tempel Blaha LLC

(57) ABSTRACT

A component carrier with a double layer structure is illustrated and described. The double layer structure includes an electrically conductive patterned layer structure and a further patterned layer structure made of a two-dimensional material. The patterned layer structure and the further patterned layer structure have at least partly the same pattern. In an embodiment the component carrier includes a stack with at least one electrically conductive layer structure and/or at least one electrically insulating layer structure and at least one double layer structure connected with the stack.

9 Claims, 9 Drawing Sheets

(51) Int. Cl.
  *H01L 23/498* (2006.01)
  *H05K 1/03* (2006.01)
  *H05K 1/18* (2006.01)
  *H05K 3/14* (2006.01)
  *H05K 3/46* (2006.01)

(52) U.S. Cl.
  CPC ........... *H05K 1/0366* (2013.01); *H05K 1/181* (2013.01); *H05K 3/146* (2013.01); *H05K 3/4644* (2013.01); *H05K 2201/015* (2013.01); *H05K 2201/0141* (2013.01); *H05K 2201/0154* (2013.01)

(58) Field of Classification Search
  CPC ..... H05K 2201/0141; H05K 2201/015; H05K 2201/0154; H05K 2201/0338; H05K 1/0242; H05K 3/24; H05K 2201/0323; H05K 3/20; H05K 3/4682; H01L 21/4857; H01L 23/49822; H01L 23/373; H01L 23/49877
  See application file for complete search history.

(56) References Cited

U.S. PATENT DOCUMENTS

| | | | |
|---|---|---|---|
| 9,460,828 B2 | 10/2016 | Wu et al. | |
| 9,614,286 B2 * | 4/2017 | Du | H01Q 1/241 |
| 2006/0022888 A1 * | 2/2006 | Cheng | H01Q 9/28 |
| | | | 343/795 |
| 2011/0037673 A1 * | 2/2011 | Huang | H01Q 9/065 |
| | | | 343/793 |
| 2013/0009320 A1 * | 1/2013 | Yoo | H01L 23/5226 |
| | | | 257/774 |
| 2013/0068521 A1 | 3/2013 | Hong et al. | |
| 2013/0154890 A1 * | 6/2013 | Jan | H01Q 1/521 |
| | | | 343/770 |
| 2013/0248229 A1 | 9/2013 | Martens | |
| 2013/0306364 A1 * | 11/2013 | Suzuki | H05K 9/0088 |
| | | | 174/394 |
| 2014/0111953 A1 * | 4/2014 | McClure | H05K 1/147 |
| | | | 361/749 |
| 2014/0291819 A1 | 10/2014 | Barth | |
| 2015/0380797 A1 | 12/2015 | Yoshida et al. | |
| 2016/0202613 A1 | 7/2016 | Di et al. | |
| 2017/0025757 A1 * | 1/2017 | Iancu | H01Q 3/36 |
| 2017/0329436 A1 * | 11/2017 | Choi | G06F 3/0445 |
| 2018/0097191 A1 | 4/2018 | Wang | |
| 2018/0287431 A1 * | 10/2018 | Liu | H01Q 21/28 |
| 2018/0359858 A1 * | 12/2018 | Ito | H01Q 1/38 |
| 2020/0163203 A1 * | 5/2020 | Park | H05K 3/32 |

FOREIGN PATENT DOCUMENTS

| | | |
|---|---|---|
| KR | 20130132103 A | 12/2013 |
| WO | 2014076613 A1 | 5/2014 |
| WO | 2019020795 A1 | 1/2019 |

OTHER PUBLICATIONS

JP2005347387 English Translation, Canon (Year: 2005).*
Extended European Search Report in Application 19168416.6; dated Oct. 15, 2019; pp. 1-9, European Patent Office, 80298, Munich, Germany.

* cited by examiner

COMPONENT CARRIER COMPRISING A DOUBLE LAYER STRUCTURE

CROSS-REFERENCE TO RELATED APPLICATION

This application claims the benefit of the filing date of the European Patent Application No. 19 168 416.6, filed Apr. 10, 2019, the disclosure of which is hereby incorporated herein by reference.

TECHNICAL FIELD

The invention relates to a double layer structure for manufacturing a component carrier and to a component carrier comprising such a double layer structure.

TECHNOLOGICAL BACKGROUND

In the field of high-frequency (HF) and high-speed applications, it is often desired to obtain high electron mobility, low resistances and materials having low surface roughness. Graphene exhibits these characteristics and is a good candidate for HF applications. However, the integration of graphene is usually extremely difficult due to the poor handling of graphene layers while depositing the same on another element to the desired location.

SUMMARY

There may be a need to provide a double layer structure for manufacturing a component carrier, a component carrier, a method of manufacturing a double layer structure for manufacturing a component carrier, and a method of using a double layer structure, by which the integration of a two-dimensional material such as graphene is inexpensive and compatible to integration processes in the conventional technologies of manufacturing a component carrier (such as printed circuit board (PCB) technology), while the performance of the resulting component carrier is improved.

A double layer structure for manufacturing a component carrier, a component carrier, a method of manufacturing a double layer structure for manufacturing a component carrier, and a method of using a double layer structure according to the independent claims are provided.

According to an exemplary embodiment of the invention, a double layer structure for manufacturing a component carrier is provided. The double layer structure is composed of an electrically conductive patterned layer structure, and a further patterned layer structure made of a two-dimensional material, wherein the patterned layer structure and the further patterned layer structure have at least partly the same pattern.

According to an exemplary embodiment of the invention, a component carrier is provided. The component carrier comprises a stack comprising at least one electrically conductive layer structure and/or at least one electrically insulating layer structure, and at least one of the above-described double layer structure connected with the stack.

According to an exemplary embodiment of the invention, a method of manufacturing a double layer structure for manufacturing a component carrier is provided. The method comprises connecting an electrically conductive layer structure with a further layer structure made of a two-dimensional material, and commonly patterning at least a part of the electrically conductive layer structure and the further layer structure.

According to an exemplary embodiment of the invention, a method of using the double layer structure in a component carrier is provided, wherein the double layer structure is used for a high-frequency and/or high-speed application.

According to an exemplary embodiment of the invention, a method of manufacturing a component carrier includes forming a double layer structure from an electrically conductive patterned layer structure and a further patterned layer structure made of a two-dimensional material, wherein the patterned layer structure and the further patterned have at least partially the same pattern and connecting the double layer structure with a stack having at least one electrically conductive layer structure and/or at least one electrically insulating layer structure.

OVERVIEW OF EMBODIMENTS

A two-dimensional material usually is a crystalline material consisting of only one layer of atoms. In an embodiment, the further patterned layer structure either is one monolayer or comprises a plurality of parallel monolayers of the two-dimensional material.

The two-dimensional material can be graphene which can be obtained on or beneath copper sheets, for example by a roll-to-roll method. Since the base conductive material in the PCB (printed circuit board) technology is copper, the graphene on or beneath a copper sheet can readily be integrated while manufacturing PCBs.

The present invention is not limited to graphene as the two-dimensional material. Other suitable examples of a two-dimensional material are graphyne, borophene, germanene, silicene, $Si_2BN$, stanene, phosphorene, bismuthene, molybdenite, 2D alloys, 2D supracrystals, and compounds thereof. Other compounds of a two-dimensional material are graphane (a two-dimensional polymer of carbon and hydrogen), boronitren (nanomesh, two-dimensional boron nitride, also known as white graphene), hexagonal boron nitride, borocarbonitrides, germanane, molybdenum (IV) sulphide, transition metal dichalcogenides (TMDCs), MXenes, etc.

In an embodiment of the present invention, a copper layer can be patterned or structured and have a graphene layer on it or beneath it. Once the patterning on the copper layer is made, for example with conventional PCB-related manufacturing processes, such patterned structures can be used as a mask in a subsequent patterning or structuring step of the graphene layer which is present on or beneath the copper layer. The so-obtained pattern can then be used for high-frequency (HF) and high-speed applications to utilize the physical properties of the graphene.

A physical background in the development of the present invention is the so-called skin effect that occurs in HF or higher-frequency bands of HF electronic applications. As a consequence of electromagnetic interactions, the charge carriers tend to flow closer to the surface of the conductor so that a layer (skin) is formed. The thickness of the charge carrier layer is inversely proportional to the square root of the applied signal frequency and directly proportional to the square root of the material's specific resistance. In other words, the higher the signal frequency is, the closer to the conductor's surface the charge carriers will flow. As an example, the skin thickness in copper can vary from 29.7 mm for a 5 Hz signal down to 52.4 nm for a 1.6 THz signal. In high-frequency bands, imperfections such as a roughness on the surface of the copper conductor can extremely interfere with the signal transmission due to the increase of the electronic path (the actual physical distance where the electrons flow in the conductor).

For example, graphene with its very low specific resistance and capacity to large amounts of current densities can be used to overcome this object.

In the following, further exemplary embodiments of the present invention will be explained.

In an embodiment, the double layer structure is obtained by using either the electrically conductive patterned layer structure or the further patterned layer structure as a mask for patterning the other one of the electrically conductive patterned layer structure and the further patterned layer structure. The manufacturing process is facilitated because a separate mask can be omitted. This masking is possible since the electrically conductive patterned layer structure and the further patterned layer structure of the double layer structure have different physical and/or chemical properties so that one of them is patterned while using the other one as a mask.

In an embodiment, the electrically conductive patterned layer structure is a metal plate or foil, in particular of copper.

In an embodiment, the further patterned layer structure is made of graphene. Graphene material presents very high electron mobility which is a consequence of long electron scattering times and low electron effective masses. This allows electrons in the graphene to respond very rapidly to EM stimulus. Graphene can be a very good shielding material for high frequencies in the EM spectrum of UHF. Nevertheless, graphene is very thin and can be permeable from a certain lower threshold frequency on. If the electrically conductive patterned layer structure is made of copper, the copper in turn can shield signals having lower frequencies. In an embodiment, the double layer structure forms a part of an antenna, an electric conductor or an electromagnetic shielding. Due to the double layer structure, the different physical characteristics of the electrically conductive patterned layer structure and the further patterned layer structure can be combined to obtain synergistic effects.

For example, if the double layer structure forms a part of a conductor, the further patterned layer structure, which can be made of graphene, can transmit a UHF signal in a PCB application, i.e. a signal having frequencies that generate a skin effect in a copper layer. Graphene material exhibits very high electron mobility because of long electron scattering times and low electron effective masses. This allows electrons in the graphene to respond very rapidly to an EM stimulus (for example in the UHF band or higher bands). In an embodiment of the present invention, the double layer structure can be used to transmit a HF signal through the electrically conductive patterned layer structure, which can be made of copper, and to transmit an UHF signal (or SHF and EHF signals) through the further patterned layer structure which can be made of graphene. The copper layer can be thicker than the graphene layer and have a lower absolute electrical resistance. For the UHF band or higher bands, the electrical resistance of copper will be too large due to the skin effect. At these frequencies, the signal can the transmitted along, on or through the graphene layer.

For example, if the double layer structure forms a part of an antenna, the principle of the superposition of a double layer structure can also allow the PCB to form a dual channel for signal transmission. The double layer structure can form a dual-band antenna. Both channels (for example copper and graphene) can transmit a signal independently. For example, signals of a lower frequency can flow in a copper layer and produce low end frequencies electromagnetic waves, while higher frequencies can flow on the graphene layer.

The double layer structure can also be used as an EM shielding. The further patterned layer structure, which can be made of graphene, can shield the PCB against higher frequencies that might otherwise be permeable to the PCB.

In an embodiment, the further patterned layer structure is at least partly arranged between the electrically conductive patterned layer structure and the at least one electrically insulating layer structure.

In an embodiment, the electrically conductive patterned layer structure is at least partly arranged between the further patterned layer structure and the at least one electrically insulating layer structure. Furthermore, in a multilayer configuration, the further layer structure can be integrated on the top as well as on the bottom of the component carrier.

In an embodiment, the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of a group consisting of copper, aluminum, nickel, silver, gold, palladium, and tungsten, any of the mentioned materials being optionally coated with supra-conductive material such as graphene; wherein the electrically insulating layer structure comprises at least one of a group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

In an embodiment, the method comprises patterning of one of the electrically conductive patterned layer structure and the further patterned layer structure while using the other one of the electrically conductive patterned layer structure and the further patterned layer structure as a mask. The manufacturing process is facilitated because a separate mask can be omitted. This masking is possible since the electrically conductive patterned layer structure and the further patterned layer structure of the double layer structure have different physical and/or chemical properties so that one of them is patterned while using the other one as a mask.

In an embodiment, the further patterned layer structure is patterned by plasma etching, e.g., air plasma, reactive ion etching etc.

In an embodiment, the method comprises depositing the further layer structure on the electrically conductive layer structure by chemical and/or physical vapor deposition.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of a group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo imagable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high-frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of a group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a dynamic random access memory (DRAM) or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
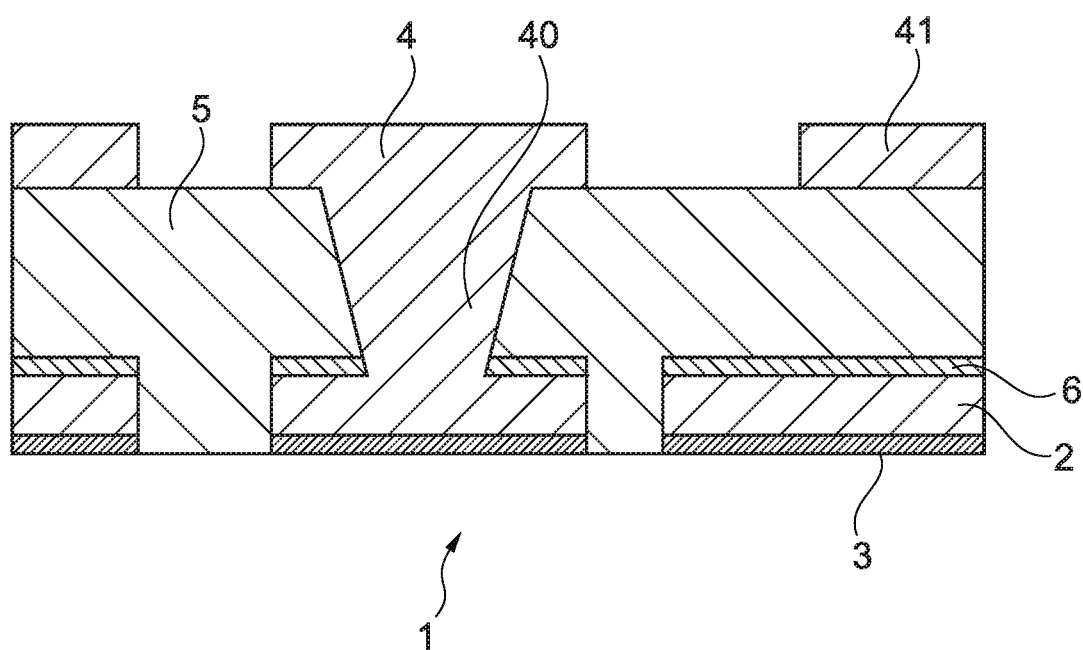
FIG. 1 illustrates a cross-sectional view of component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment, a nano-coated structure may be used for component carrier technology, in particular as a dry-adhesive structure. An adhesive layer implementing such a surface configuration may also be denoted as gecko film. The adhesive effect of such a surface may be based on van der Waals forces. According to an exemplary embodiment of the invention, a reliable substrate and/or structured material is provided for embedding and/or surface mounting applications having specific adhesion properties due to a corresponding configuration of nano- and/or microstructures on this surface. Exemplary embodiments have the advantage that the mentioned adjustability of the surface adhesion properties may be obtained with low material consumption, low production costs, small contamination risk, and high process reliability.

In an embodiment, the mentioned materials may be used as support for component placement in embedding technologies. Compared to a traditional adhesive tape system that is depending on temperature and time, an exemplary embodiment uses the surface of a support (which may be rigid or flexible) or a PCB element (such as cores, prepregs, copper foils, etc.), that exhibits, thanks to the nano- and/or microstructures, van der Waals attraction forces, a gecko effect, a high grip, and that is dry and thus can be cleaned and reused. A sheet with nano- and/or microstructures can also be included in the final product. When used for an embedding concept, components may be placed on the dry surface and can be held in position by weak bonds (like van der Waals forces, gecko effect, high grip values) prior to the component lamination.

Such an architecture allows to obtain a dry interaction between the component and the holding substrate. No additional liquid adhesive is required. This has the advantages of a dry interaction, and a reduction of risk of contamination from the substrate.

FIG. 1 illustrates a cross-sectional view of component carrier 1 according to an exemplary embodiment of the invention. The component carrier 1 can comprise at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

The component carrier 1 can be shaped as a plate. The component carrier 1 can be configured as one of a group consisting of a printed circuit board, a substrate, and an interposer. The component carrier 1 can be configured as a laminate-type component carrier.

The component carrier 1 comprises a stack having an electrically conductive layer structure 4 and an electrically insulating layer structure 5.

The electrically conductive layer structure 4 of the component carrier 1 can comprise at least one of a group consisting of copper, aluminum, nickel, silver, gold, palladium, and tungsten, any of the mentioned materials being optionally coated with supra-conductive material such as graphene.

The electrically conductive layer structure 4 includes at least one via 40 and at least one patterned layer 41. The at least one via 40 can be a laser via, but the here described methods can use other processes to form a via, such as vias which are plated through holes, photovias, etc.

The electrically insulating layer structure 5 can comprise at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

The component carrier 1 further comprises a double layer structure 2, 3 which is connected with the stack. The double layer structure 2, 3 is composed of an electrically conductive patterned layer structure 2 and a further patterned layer structure 3 made of a two-dimensional material. The patterned layer structure 2 and the further patterned layer structure 3 have at least partly the same pattern, i.e., they are at least partly commonly patterned. In more detail, the double layer structure 2, 3 can be obtained by using the electrically conductive patterned layer structure 2 as a mask for patterning the further patterned layer structure 3.

The electrically conductive patterned layer structure 2 can be a copper foil.

The further patterned layer structure 3 can be made of graphene. The further patterned layer structure 3 can either be one monolayer or comprise a plurality of parallel monolayers.

The electrically conductive patterned layer structure 2 can optionally comprise an adhesion-promoting layer 6. If the electrically conductive patterned layer structure 2 is made of copper, the adhesion-promoting layer 6 can be an oxide layer. The adhesion-promoting layer 6 can also be an activated layer. The adhesion-promoting layer 6 could simply also be a predetermined roughness (of the copper) facing towards a dielectric side of the electrically conductive patterned layer structure 2.

The electrically conductive patterned layer structure 2 is partly arranged between the further patterned layer structure 3 and the electrically insulating layer structure 5. Another part of the electrically conductive patterned layer structure 2 is arranged between the further patterned layer structure 3 and the electrically conductive layer structure 4, more precisely between the further patterned layer structure 3 and the via 40 of the electrically conductive layer structure 4.

The further patterned layer structure 3 (for example as a structured graphene multilayer) is arranged on the electrically conductive patterned layer structure 2 (for example as a copper layer 2) at a surface side of the electrically conductive patterned layer structure 2 (the surface side of the electrically conductive patterned layer structure 2 is opposed to a dielectric side of the electrically conductive patterned layer structure 2).

The double layered structure 2, 3 of the component carrier 1 can form a part of an electrical conductor, an antenna or an electromagnetic shielding, which is described later in more detail.

Figure 2:
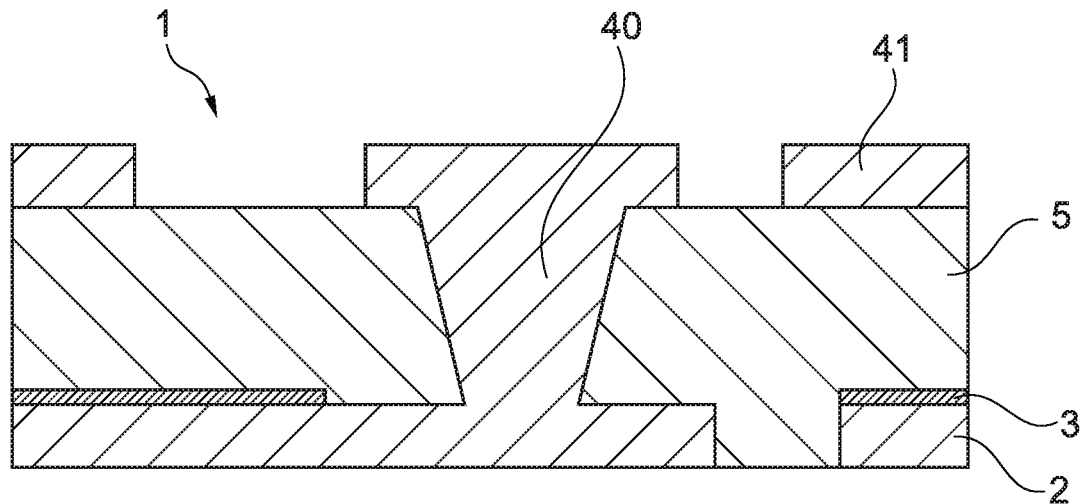
FIG. 2 illustrates a cross-sectional view of component carrier according to an exemplary embodiment of the invention.

FIG. 2 illustrates a cross-sectional view of component carrier 1 according to an exemplary embodiment of the invention. The component carrier 1 of the embodiment in FIG. 2 is similar to the component carrier 1 of FIG. 1 except for the internal arrangement of the electrically conductive patterned layer structure 2 and the further patterned layer structure 3 in the double layer structure. In more detail, the further patterned layer structure 3 is arranged between the electrically conductive patterned layer structure 2 and the electrically insulating layer structure 5. The further patterned layer structure 3 (for example as a structured graphene multilayer) is arranged on or beneath the electrically conductive patterned layer structure 2 (for example as a copper layer 2) at a dielectric side of the electrically conductive patterned layer structure 2.

The further patterned layer structure 3 can optionally comprise an adhesion-promoting layer (not shown). This adhesion-promoting layer could simply be formed by a predetermined roughness of the further patterned layer structure 3 facing towards a dielectric side of the further patterned layer structure 3.

Figure 3:
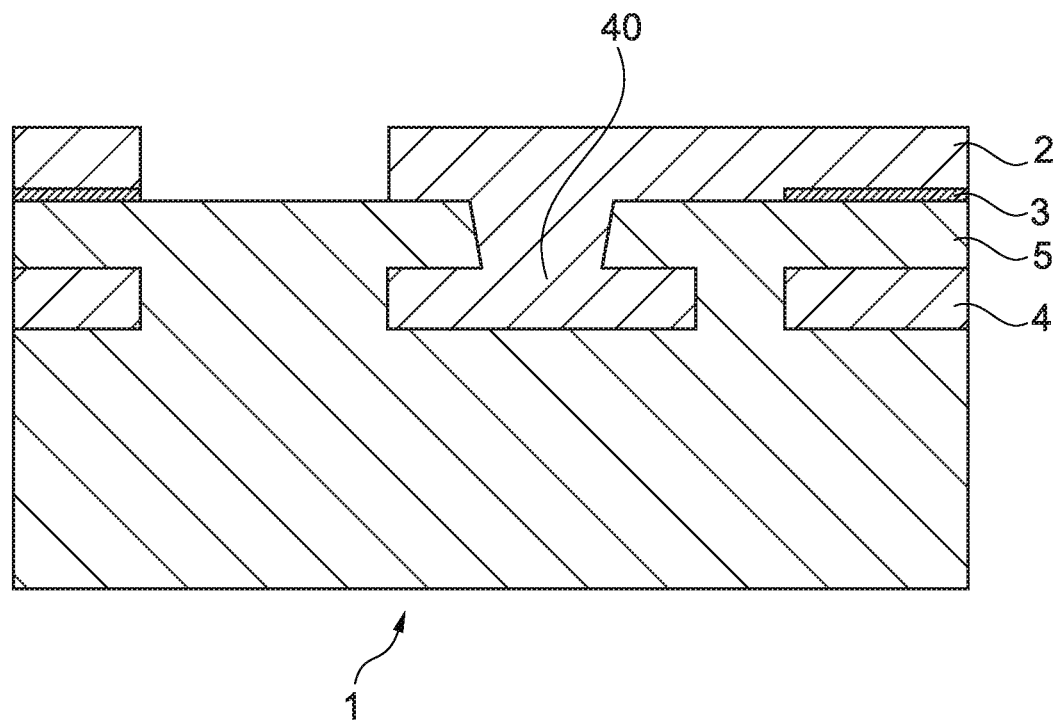
FIG. 3 illustrates a cross-sectional view of component carrier according to an exemplary embodiment of the invention.

FIG. 3 illustrates a cross-sectional view of component carrier 1 according to an exemplary embodiment of the invention. The component carrier 1 of the embodiment in FIG. 3 is similar to the component carrier 1 of FIG. 2 except for the following differences. The electrically conductive patterned layer structure 2 is one of the outermost layers of the component carrier 1. At the opposed side of the component carrier 1, the stack is formed by a so called multilayer printed circuit board (PCB).

Figure 4:
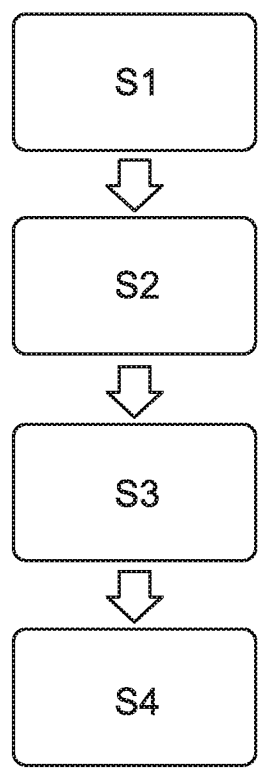
FIG. 4 illustrates a method of manufacturing a double layer structure according to an exemplary embodiment of the invention.

FIG. 4 illustrates a method of manufacturing a double layer structure according to an exemplary embodiment of the invention.

In a step S1, a copper foil or a copper layer with a graphene layer is laminated onto a protective and/or support layer. The protective and/or support layer can be made of a dielectric.

Alternatively, a copper layer or a copper foil can be deposited or laminated onto a support structure, and a graphene layer can be deposited thereon, for example by CVD. If the copper layer or the copper foil has a suitable thickness, the same acts as a support structure.

In a step S2, the copper foil or the copper layer is patterned or structured.

In a step S3, the patterned copper foil or the patterned copper layer is used as a mask for patterning the exposed graphene layer. The graphene layer can be patterned by air plasma etching.

In a step S4, the thus obtained double layer structure, which comprises the patterned graphene layer and the patterned copper foil or the patterned copper layer, is further processed in a conventional manner. For example, a component carrier or a PCB can be manufactured on the basis of the thus obtained double layer structure.

Figure 5:
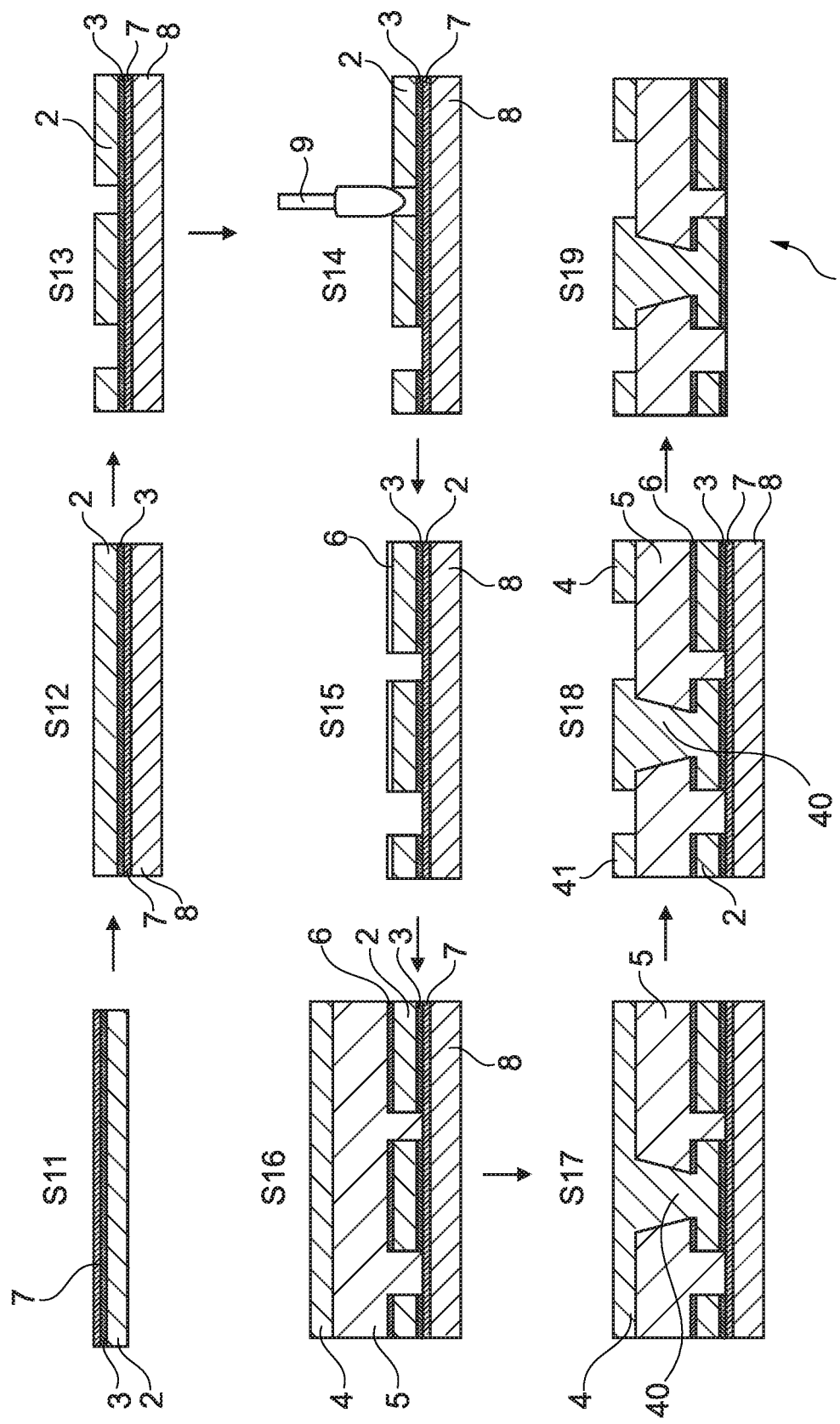
FIG. 5 illustrates a method of manufacturing a component carrier according to an exemplary embodiment of the invention.

FIG. 5 illustrates a method of manufacturing a component carrier 1 according to an exemplary embodiment of the invention.

In a step S11, a preform is provided, which comprises an electrically conductive layer structure 2 such as a copper foil, and a further layer structure 3 made of a two-dimensional material such as graphene. A protective layer 7 is arranged on top of the further layer structure 3. The protective layer 7 protects the further layer structure 3 during the subsequent manufacturing steps.

In a step S12, a support layer 8 is arranged to the protective layer 7. The support layer 8 can be made of any suitable material, for example a dielectric material. The support layer 8 might contain an adhesive layer in order to mechanically anchor itself on the protective layer, guaranteeing an increased stability of the product along all process steps.

In a step S13, the electrically conductive layer structure 2 is patterned or structured to become an electrically conductive patterned layer structure 2. The patterning process can be made by any conventional patterning process such as conventional processes which are used for patterning a copper layer or copper foil.

In a step S14, the further layer structure 3 is patterned or structured while using the electrically conductive patterned layer structure 2 as a mask. For example, if the further layer structure 3 is a graphene layer, a plasma tool 9 can be used for patterning the further layer structure 3. The further layer structure 3 thus becomes a further patterned layer structure 3.

In a step S15, an adhesion-promoting layer 6 is provided in/on the electrically conductive patterned layer structure 2. The adhesion-promoting layer 6 can be an oxide layer such as black oxide, or an organic film. The oxide layer roughens the surface so that a mechanical adhesion is achieved with the adhesion partner. The organic film achieves a rather chemical adhesion with the adhesion partner.

In a step S16, a stack is provided on the adhesion-promoting layer 6, wherein the stack comprises at least one electrically conductive layer structure 4 and at least one electrically insulating layer structure 5. In more detail, an electrically insulating layer structure 5 is arranged on the adhesion-promoting layer 6, and an electrically conductive layer structure 4 is arranged on the electrically insulating layer structure 5. The electrically insulating layer structure 5 can be a prepreg (PP) and the electrically conductive layer structure 4 can be a copper foil, which are laminated onto the intermediate product obtained in step S15.

In steps S17 and S18, conventional patterning processes are carried out for the stack. In more detail, a via 40 of an electrically conducting material is formed in the electrically insulating layer structure 5. The via 40 can be a laser via, a photo via or a plated through hole. The outermost layer of the electrically conductive layer structure 4 is patterned to obtain an electrically conductive, patterned layer structure 41.

In a step S19, the support layer 8 and the protective layer 7 are delaminated or removed so that the component carrier 1 is finished.

Figure 6:
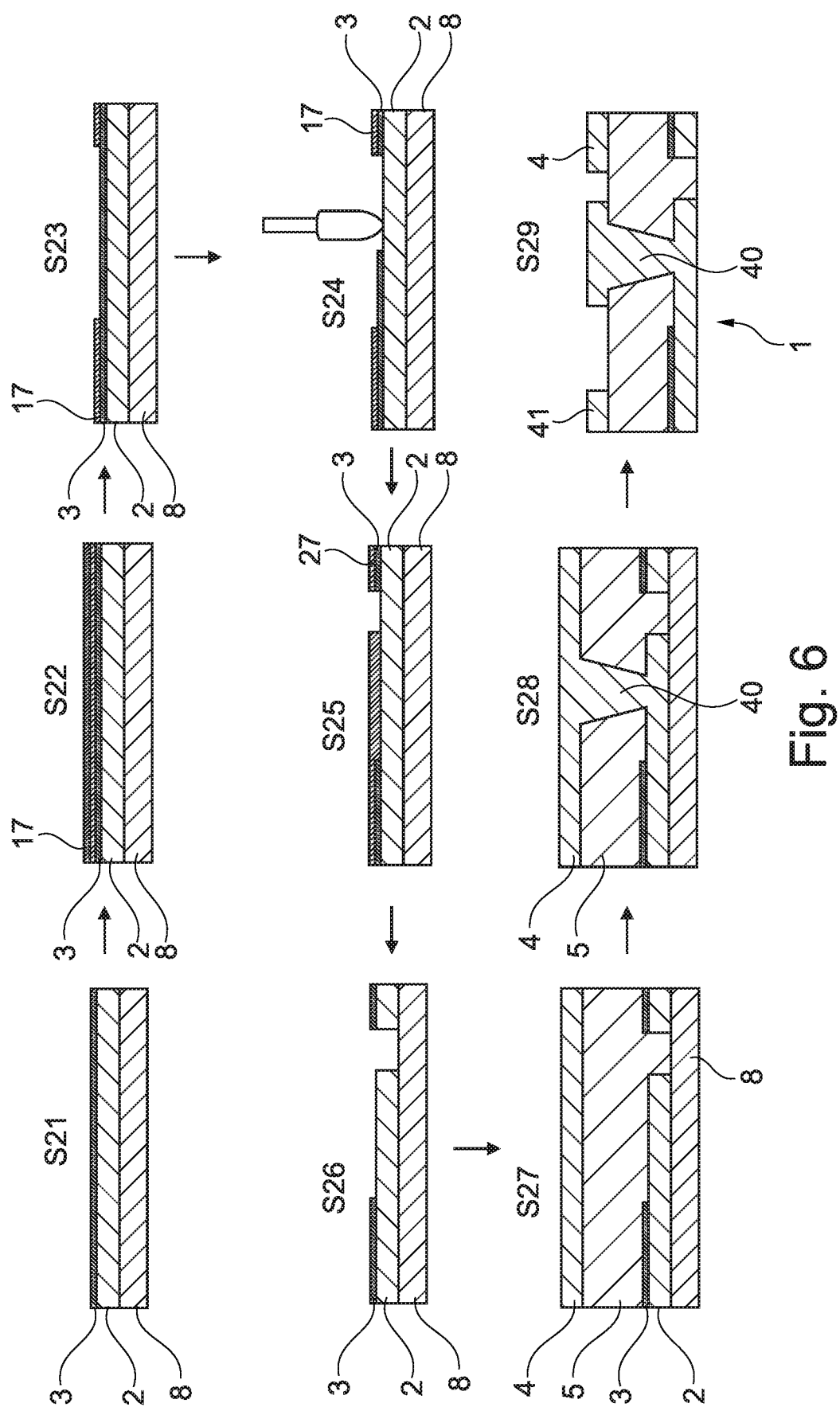
FIG. 6 illustrates a method of manufacturing a component carrier according to an exemplary embodiment of the invention.

FIG. 6 illustrates a method of manufacturing a component carrier 1 according to an exemplary embodiment of the invention.

In a step S21, a preform is provided, which comprises an electrically conductive layer structure 2 such as a copper foil, and a further layer structure 3 made of a two-dimensional material such as graphene. A support layer 8 is arranged to the electrically conductive layer structure 2.

In a step S22, a first dry film 17 can be arranged or applied to the further layer structure 3. The first dry film 17 can be made of a photoresist material.

In a step S23, the first dry film 17 is patterned or structured to become a first patterned dry film 17. The patterning process can be made by any conventional patterning process such as conventional processes which are used for patterning a dry film.

Instead of steps S22 to S23, a stencil mask or a hard mask can be used instead of providing the first dry film 17, or a precise (on spot) air plasma etching step or a physical etching step such as ion milling (for example Argon etching) can be performed. Thereby, steps S22 and S23 can be omitted.

In a step S24, the further layer structure 3 is patterned or structured while using at least a part of the first patterned dry film 17 as a mask. For example, if the further layer structure 3 is a graphene layer, an air plasma tool 9 can be used for patterning the further layer structure 3. Instead of the air plasma tool 9, any other plasma process can be used for patterning the further layer structure 3. For example, a controlled atmosphere plasma with etching agents can also be used. The further layer structure 3 thus becomes a further patterned layer structure 3. Thereafter, the first patterned dry film 17 can optionally be removed.

In a step S25, a second dry film 27 can be applied on the further patterned layer structure 3 and/or on the first dry film 17. The second dry film 27 is patterned to become a second patterned dry film 27. The second dry film 27 can be made of a photoresist material. Instead of step S25, a stencil mask or a hard mask can be used instead of providing the second dry film 27, or a precise (on spot) air plasma etching step or a physical etching step such as ion milling (for example Argon etching) can be performed.

In a step S26, the second patterned dry film 27 and/or on the first dry film 17 and/or a part of the further patterned layer structure 3 are used as a mask for patterning or structuring the electrically conductive layer structure 2 which thus becomes an electrically conductive patterned layer structure 2. The patterning of the electrically conductive layer structure 2 can be made by etching such as copper etching. The first and second patterned dry films 17, 27 are removed. Depending on the dry film material, the first and/or the second patterned dry film 17, 27 can also be kept as a first dielectric layer, and a second dielectric layer can be laminated thereon to form an electrically insulating layer structure 5 (as later described in step S27).

Optionally, an adhesion-promoting layer (not shown in FIG. 6) can be provided in/on the electrically conductive patterned layer structure 2.

In a step S27, a stack is provided on the electrically conductive patterned layer structure 2, wherein the stack comprises at least one electrically conductive layer structure 4 and at least one electrically insulating layer structure 5. In more detail, an electrically insulating layer structure 5 is arranged on the electrically conductive patterned layer structure 2 (or the adhesion-promoting layer 6), and an electrically conductive layer structure 4 is arranged on the electrically insulating layer structure 5.

In a step S28, conventional patterning processes are carried out for the stack. In more detail, a via 40 of an electrically conducting material is formed in the electrically insulating layer structure 5.

In a step S29, the outermost layer of the electrically conductive layer structure 4 is patterned to obtain an electrically conductive, patterned layer structure 41. The support layer 8 is then delaminated or removed so that the component carrier 1 is finished.

Figure 7:
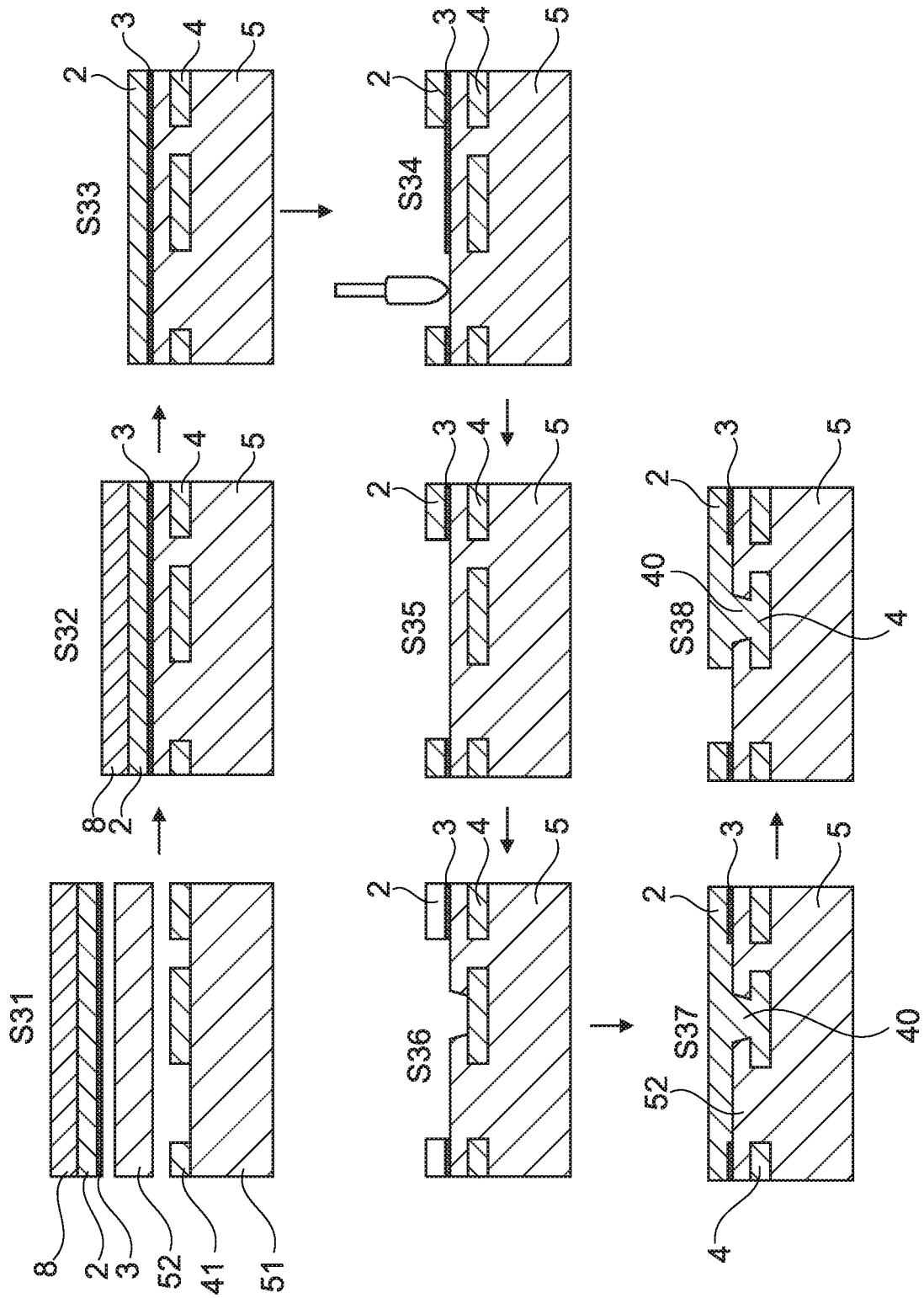
FIG. 7 illustrates a method of manufacturing a component carrier according to an exemplary embodiment of the invention.

FIG. 7 illustrates a method of manufacturing a component carrier 1 according to an exemplary embodiment of the invention.

In steps S31 and S32, an intermediate product is provided, which comprises a double layer structure including an electrically conductive layer structure 2 such as a copper layer or copper foil, and a further layer structure 3 made of a two-dimensional material such as graphene. A support layer 8 is arranged to the electrically conductive layer structure 2. Furthermore, a so-called N-layer (multilayer) printed circuit board (PCB), which has at least one electrically insulating layer structure 51 and at least one patterned electrically conductive layer structure 41, and a resin or prepreg (PP) sheet 52 are laminated on the further layer structure 3. The resin or prepreg (PP) sheet 52 is arranged between the patterned electrically conductive layer structure 41 and the further layer structure 3. The at least one electrically insulating layer structure 51 and the resin or prepreg (PP) sheet 52 form together an electrically insulating layer structure 5 when the component carrier 1 is finished.

In a step S33, the support layer 8 is removed or delaminated.

In steps S34 and S35, the electrically conductive layer structure 2 is patterned or structured to become an electrically conductive patterned layer structure 2. The patterning of the electrically conductive layer structure 2 can be made by etching such as copper etching.

The further layer structure 3 is then patterned to become a further patterned layer structure 3. This patterning process can be made by air plasma etching, wherein at least a part of the electrically conductive patterned layer structure 2 is used as a mask.

In steps S36 and S37, at least one via 40 is formed in the resin or prepreg sheet 52 by patterning the resin or prepreg sheet 52 in the step S36 and by filling the resulting holes with an electrically conductive material, for example copper, in the step S37.

In a step S38, the outermost layer, which comprises the electrically conductive layer structure 2 and/or the electrically conductive material which has been applied in the step S38, is patterned or structured.

FIGS. 5 to 7 show possible configurations, where one graphene monolayer (ML) can be integrated into the component carrier 1. It has to be mentioned that more complex products can be obtained with a plurality of graphene monolayers at different levels into a component carrier 1, for example by combining method steps shown in FIG. 5 to FIG. 7.

For example, in a multilayer configuration, the further layer structure 3 can be integrated on the top as well as on the bottom of the component carrier 1 by performing the method steps of FIG. 7 on both sides of the component carrier 1.

Furthermore, the graphene layer 3 onto the copper foil 2 can be provided or transferred on a support for improved handling.

Figure 8:
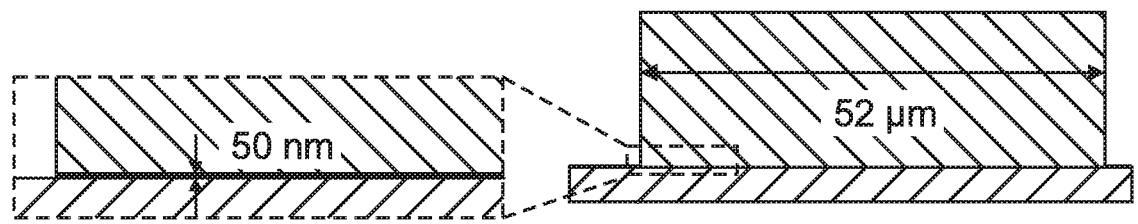
FIG. 8 illustrates a model of a conductor used in a simulation to determine a transmission coefficient against the frequency.

FIG. 8 illustrates a model of a conductor used in a simulation to determine a transmission coefficient against the frequency.

The conductor comprises a copper base element having a width of 52 μm, onto which a thin layer or a film of a high-conductive material having a height of 50 nm is applied. The electrical conductivity of the high-conductive material is 2×109 S/m which is comparable to values found in the literature for graphene, while the electrical conductivity of copper is 5.96×107 S/m.

Figure 9:
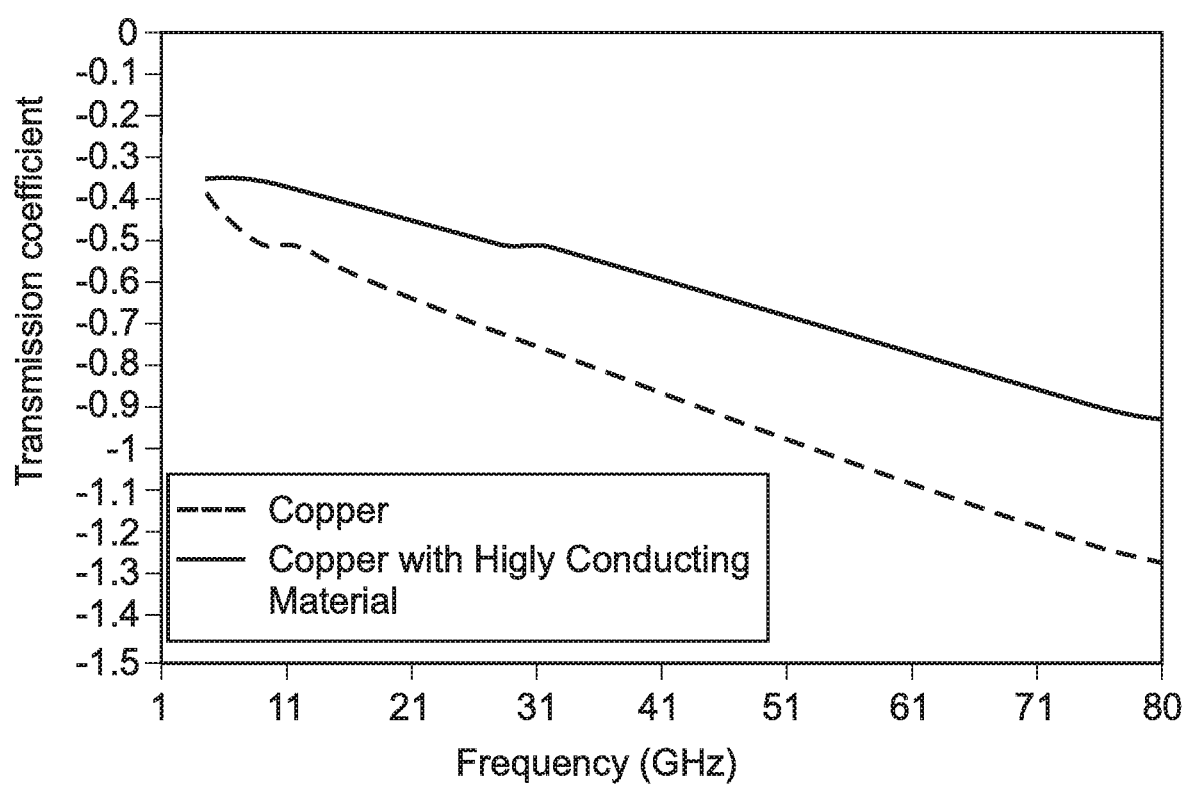
FIG. 9 illustrates the result in the simulation of FIG. 8 to determine the transmission coefficient against the frequency.

FIG. 9 illustrates the result in the simulation of FIG. 8 to determine the transmission coefficient against the frequency. The lower curve shows a transmission coefficient against the frequency of a reference model, which comprises exclusively copper and has the same dimension as the conductor shown in FIG. 8, while the upper curve shows a transmission coefficient against the frequency of the conductor shown in FIG. 8, which comprises copper and the high-conductive material. FIG. 9 shows a trend that, if the frequency is higher than about 3 GHz, the transmission coefficient of the conductor shown in FIG. 8 becomes higher than that of the reference model. In general, the simulations revealed that adding a highly-conductive material onto the copper foil results in a better trend of the transmission coefficient against the frequency compared with a pure copper foil.

FIG. 9 shows a general tendency in the example which is shown in FIG. 8.

Figure 10:
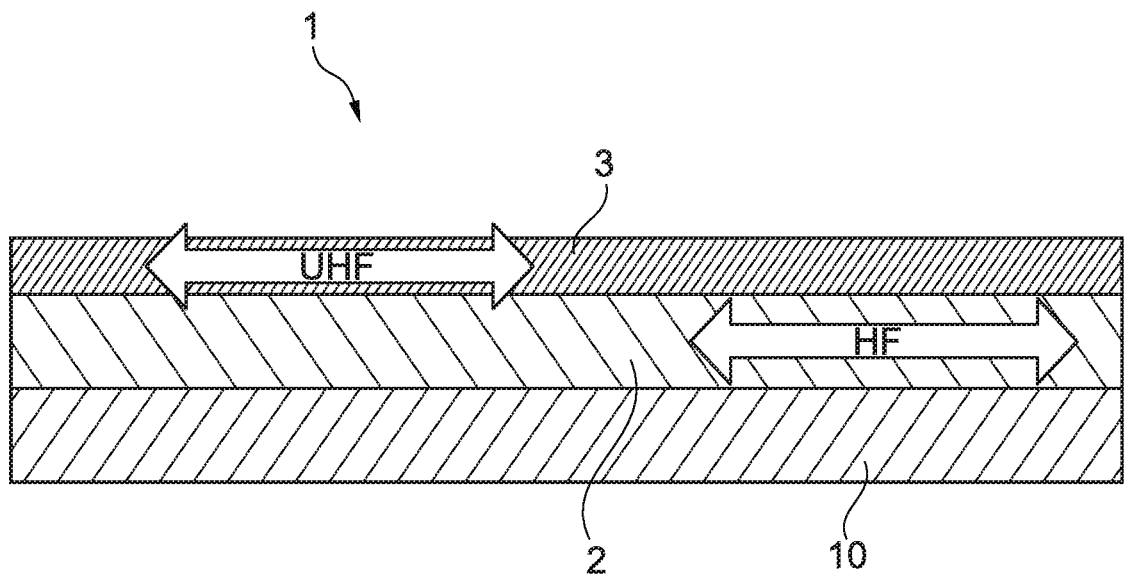
FIG. 10 illustrates a principle where a component carrier according to an exemplary embodiment of the invention can be used as an electric conductor for high frequency and/or ultra-high frequency applications.

FIG. 10 illustrates a principle where a component carrier 1 according to an exemplary embodiment of the invention can be used as an electric conductor in high-frequency and/or ultra-high frequency applications. The component carrier 1 comprises a printed circuit board (PCB), which can comprise a stack 10 having at least one electrically conductive layer structure and/or at least one electrically insulating layer structure, and a double layer structure 2, 3 connected with the stack 10, wherein the double layer structure 2, 3 comprises an electrically conductive patterned layer structure 2, here for example a copper layer; and a further patterned layer structure 3 made of a two-dimensional material, here for example a graphene layer.

The copper layer 2 has a larger thickness than the graphene layer 3 and therefore a lower absolute electrical resistance. However, in the UHF (Ultra-high frequency, 300 MHz-3 GHz) band and also in the SHF (Super high-frequency 3-30 GHz) and EHF (Extremely high-frequency >30 GHz) bands, in particular when the frequency is larger than 2 GHz, the electrical resistance of the copper layer 2 will be too large due to the skin effect so that the copper layer 2 can be inoperable. However, at these higher frequencies, a signal can be transmitted via the graphene layer 3. Graphene exhibits a very high electron mobility because of long electron scattering times and low electron effective masses. This allows the electrons in the graphene to respond very quickly to an EM stimulus (in the UHF and higher bands). It turned out that graphene is a suitable material for very high frequencies in the EM spectrum.

In an embodiment of the present invention, the double layer structure 2, 3 can be used to transmit a HF signal through the electrically conductive patterned layer structure 2, which can be made of copper, and to transmit an UHF signal (or SHF and EHF signals) through the further patterned layer structure 3 which can be made of graphene. The electric currents of the signal through the electrically conductive patterned layer structure 2 and of the signal through the further patterned layer structure 3 flow substantially in parallel to each other. In more detail, the electric currents of the signal through the electrically conductive patterned layer structure 2 and the signal through the further patterned layer structure 3 flow substantially in parallel a main surface of the component carrier 1.

Figure 11:
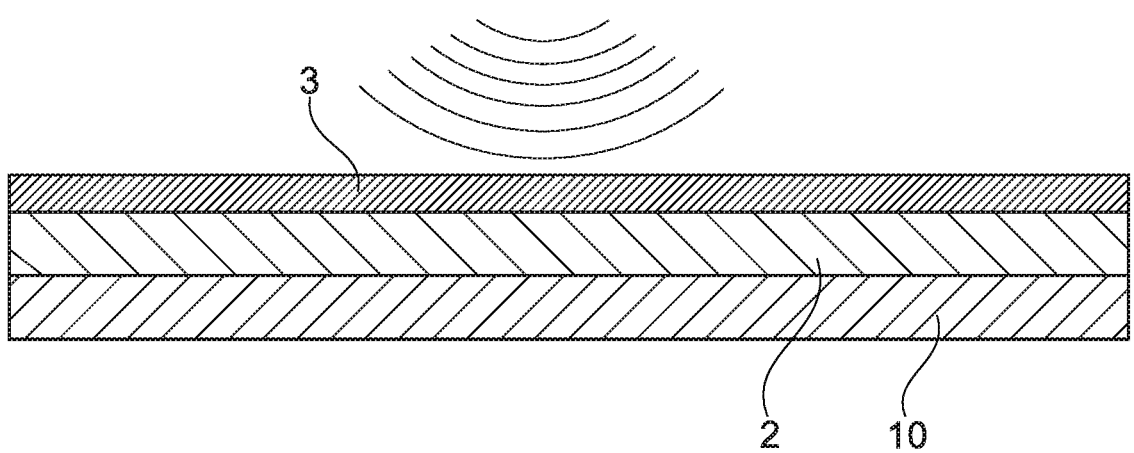
FIG. 11 illustrates a principle where a component carrier according to an exemplary embodiment of the invention can be used as an electromagnetic shielding for high-frequency and/or ultra-high frequency applications.

FIG. 11 illustrates a principle where a component carrier 1 according to an exemplary embodiment of the invention can be used as an electromagnetic shielding for high-frequency and/or ultra-high frequency applications.

As mentioned above, graphene exhibits a very high electron mobility because of long electron scattering times and low electron effective masses. This allows the electrons in the graphene to respond very quickly to an EM stimulus (in the UHF and higher bands). On the one hand, graphene has therefore a shielding effect for high end frequencies in the EM spectrum. On the other hand, the graphene layer 2 is relatively thin and thus permeable from a certain lower threshold frequency on. In this case, copper in turn can shield these lower frequencies. Also, the copper layer 2 can be made relatively thin below the μm-scale.

In an embodiment of the present invention, the double layer structure 2, 3 can be used to shield higher frequencies (UHF band or a higher band) by the further patterned layer structure 3, which can be made of graphene, and to shield lower frequencies by the electrically conductive patterned layer structure 2, which can be made of copper. The double layer structure 2, 3 can be applied upon a stack 10 in telecommunication applications.

Figure 12:
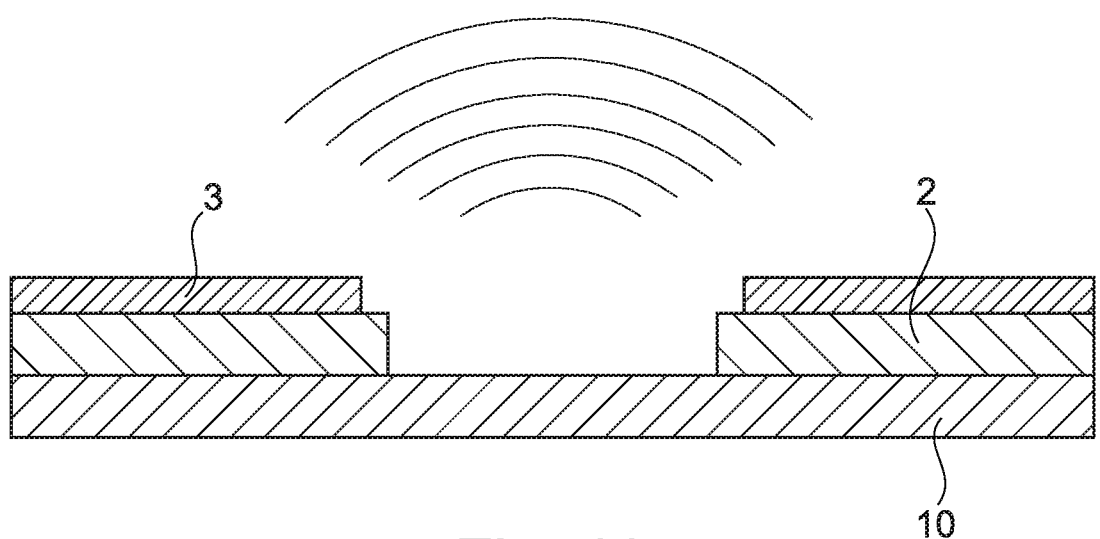
FIG. 12 illustrates a principle where a component carrier according to an exemplary embodiment of the invention can be used as an antenna for high frequency and/or ultra-high frequency applications.

FIG. 12 illustrates a principle where a component carrier 1 according to an exemplary embodiment of the invention can be used as an antenna for high-frequency and/or ultra-high frequency applications.

As mentioned above, graphene exhibits a very high electron mobility because of long electron scattering times and low electron effective masses. This allows the electrons in the graphene to respond very quickly to an EM stimulus (in the UHF and higher bands).

In an embodiment of the present invention, the double layer structure 2, 3 can be used to form a dual-band antenna upon a stack 10, where the further patterned layer structure 3, which can be made of graphene, forms a dipole antenna for higher end frequencies and the electrically conductive patterned layer structure 2, which can be made of copper, forms a dipole antenna for lower end frequencies. The lower frequency signals will flow in the copper layer 2 and produce electromagnetic waves of lower end frequencies, while higher-frequency signals (UHF band and higher bands) will flow in the graphene layer 3 and produce electromagnetic waves of higher end frequencies.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing a component carrier, the method comprising:
   providing a stack having at least one electrically conductive layer structure and at least one electrically insulating layer structure, wherein the electrically conductive layer structure is connected with a further layer structure made of a two-dimensional material to form a double layer structure; and
   commonly patterning at least a part of the electrically conductive layer structure and the further layer structure;
   wherein the double layer structure is an antenna, wherein the double layer structure forms a dual band antenna where the further patterned layer structure forms a dipole antenna for higher end frequencies and the electrically conductive patterned layer structure forms a dipole antenna for lower end frequencies.

2. The method according to claim 1, further comprising:
   patterning of one of the electrically conductive patterned layer structure and the further patterned layer structure while using the other one of the electrically conductive patterned layer structure and the further patterned layer structure as a mask.

3. The method according to claim 1, wherein the further patterned layer structure is patterned by plasma etching.

4. The method according to claim 1, further comprising:
   depositing the further layer structure on the electrically conductive layer structure by chemical vapor deposition.

5. A component carrier, comprising: a stack having at least one electrically conductive layer structure and at least one electrically insulating layer structure; and a double layer structure comprising: an electrically conductive patterned layer structure; and a further patterned layer structure made of a two-dimensional material, where the further patterned layer structure forms a dipole antenna for higher end frequencies and the electrically conductive patterned layer structure forms a dipole antenna for lower end frequencies: wherein the patterned layer structure and the further patterned layer structure have at least partly the same pattern, wherein the double layer structure forms a dual band antenna.

6. The component carrier according to claim 5, wherein the double layer structure is configured to transmit respective signals through the electrically conductive patterned layer structure and the further patterned layer structure.

7. The component carrier according to claim 5, wherein the electrically conductive patterned layer structure comprises copper and the further patterned layer structure comprises graphene.

8. The component carrier according to claim 5, wherein a thickness of the electrically patterned layer structure is greater than a thickness of the further patterned layer structure.

9. The component carrier according to claim 5, wherein the electrically patterned layer structure has a lower absolute electrical resistance than the further patterned layer structure.

* * * * *